United States Patent
Pal

(10) Patent No.: US 9,175,694 B2
(45) Date of Patent: Nov. 3, 2015

(54) AIR COOLED MOTOR CONTROLLERS

(75) Inventor: Debabrata Pal, Hoffman Estates, IL (US)

(73) Assignee: Hamilton Sundstrand Corporation, Windsor Locks, CT (US)

(*) Notice: Subject to any disclaimer, the term of this patent is extended or adjusted under 35 U.S.C. 154(b) by 623 days.

(21) Appl. No.: 13/425,045

(22) Filed: Mar. 20, 2012

(65) Prior Publication Data

US 2013/0250516 A1  Sep. 26, 2013

(51) Int. Cl.
*H05K 7/20* (2006.01)
*F04D 29/58* (2006.01)

(52) U.S. Cl.
CPC ........ *F04D 29/5813* (2013.01); *H05K 7/20909* (2013.01)

(58) Field of Classification Search
CPC ............... F28D 7/00; H01F 27/10; F28F 7/00
USPC ........................ 361/676–678, 679.46–679.54, 361/688–722, 752, 831
See application file for complete search history.

(56) References Cited

U.S. PATENT DOCUMENTS

| | | | | |
|---|---|---|---|---|
| 6,019,165 A * | 2/2000 | Batchelder | .................... | 165/80.3 |
| 6,408,937 B1 * | 6/2002 | Roy | ......................... | 165/104.33 |
| 7,379,301 B2 * | 5/2008 | Liu et al. | ....................... | 361/699 |
| 7,511,957 B2 * | 3/2009 | Campbell et al. | ............. | 361/699 |
| 2004/0108104 A1 * | 6/2004 | Luo | ............................... | 165/181 |
| 2005/0117298 A1 * | 6/2005 | Koga et al. | ..................... | 361/699 |
| 2007/0034359 A1 * | 2/2007 | Liu et al. | .................. | 165/104.31 |
| 2014/0117798 A1 * | 5/2014 | Coldwate et al. | ................ | 310/59 |

* cited by examiner

*Primary Examiner* — Courtney Smith
(74) *Attorney, Agent, or Firm* — Cantor Colburn LLP

(57) ABSTRACT

An air cooled motor controller includes a substrate and at least one inductor assembly arranged on the substrate. The at least one inductor assembly includes a outer cylindrical housing, a wound inductor core arranged within the outer cylindrical housing, and a inner cylindrical housing arranged within the wound inductor core, wherein the inner cylindrical housing defines an inner cylindrical cavity configured to transmit air, and wherein the outer cylindrical housing and the inner cylindrical housing define at least one cylindrical gap in fluid communication with the inner cylindrical cavity and configured to transmit air. The motor controller also includes at least one air source in fluid communication with the at least one cylindrical gap.

4 Claims, 6 Drawing Sheets

AIR COOLED MOTOR CONTROLLERS

BACKGROUND OF THE INVENTION

The present invention is generally directed to motor controllers, and more particularly, exemplary embodiments of the present invention are directed to air cooled motor controllers drawing cooling air from a plurality of air sources.

Conventionally, motor controllers are cooled by directing air flow over their components. Air flow is directed to various heat dissipating sources, for example, heat sinks. However, in emerging motor controllers there is increased power dissipation requirements, especially from insulated gate bipolar transistor power modules and associated inductors. The associated inductors are typically potted with a potting compound which requires a metal housing for structural support. Both the metal housing and potting compound add weight and cost to an entire inductor assembly. Furthermore, the metal housing and potting compound limit airflow about the actual inductors, and therefore, limit heat dissipation and increase airflow requirements to meet optimum operating temperature ranges.

BRIEF DESCRIPTION OF THE INVENTION

According to an exemplary embodiment of the present invention, an air cooled motor controller includes a substrate and at least one inductor assembly arranged on the substrate. The at least one inductor assembly includes an outer cylindrical housing, a wound inductor core arranged within the outer cylindrical housing, and an inner cylindrical housing arranged within the wound inductor core. The inner cylindrical housing defines an inner cylindrical cavity configured to transmit air. Also, the outer cylindrical housing and the inner cylindrical housing define at least one cylindrical gap in fluid communication with the inner cylindrical cavity and configured to transmit air. The motor controller also includes at least one air source in fluid communication with the at least one cylindrical gap.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which like elements are numbered alike:

DETAILED DESCRIPTION OF THE INVENTION

According to exemplary embodiments of the present invention, air cooled motor controllers are provided which include enhanced cooling through application of airflow from a plurality of air sources. Furthermore, exemplary embodiments of the present invention provide inductor assemblies with a reduced weight and complexity that allow for increased heat dissipation as compared to conventional potted inductors. The technical effects and benefits of exemplary embodiments include an overall reduced weight and cost of motor controllers while also providing enhanced cooling, which therefore allows for easy integration into aircraft systems.

Figure 1:
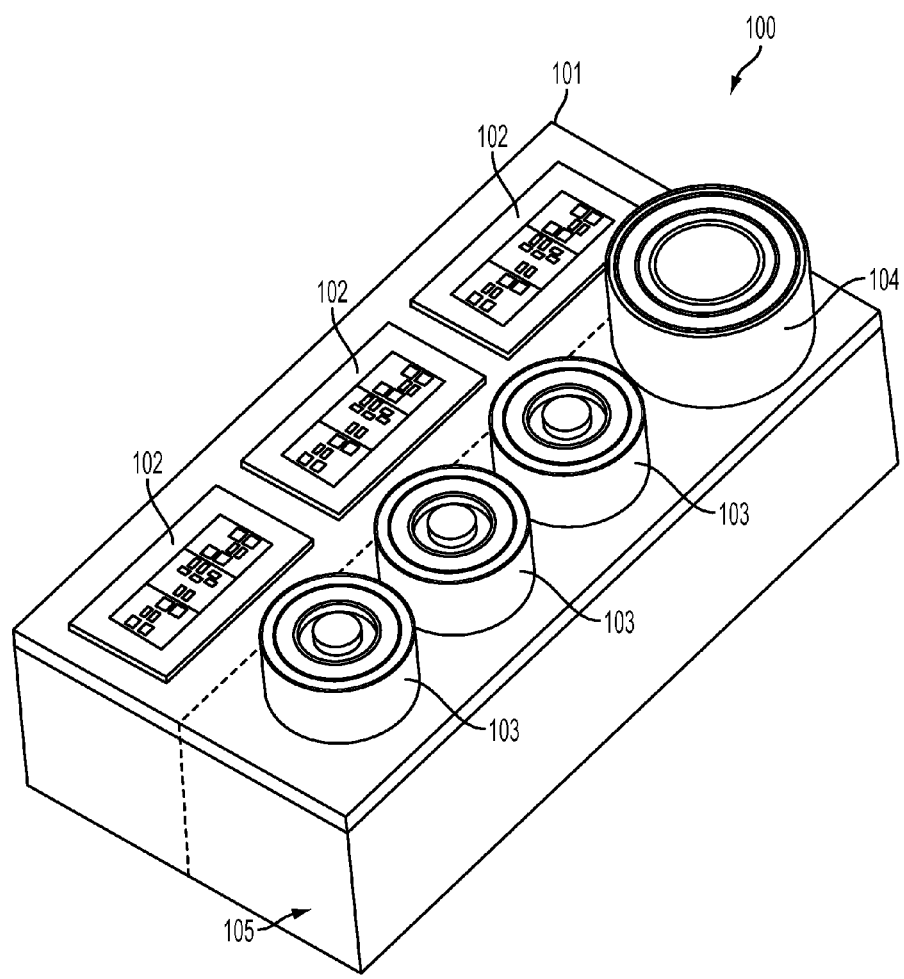
FIG. 1 illustrates an air cooled motor controller, according to an exemplary embodiment of the present invention.

Turning to FIG. 1, an air cooled motor controller 100 is illustrated. The motor controller 100 includes substrate 101. The substrate 101 may be a cold plate support substrate formed of a conductive material. The conductive material may be any material suitable for support of electronic components and suitable for conducting heat. As illustrated, the substrate may be exposed to an air source such that air flows proximate the substrate 101 through a cooling channel 105.

The motor controller 100 further includes a plurality of power modules 102 arranged on the substrate 101. The power modules 102 may be electronic power modules configured to control a motor (not illustrated). According to one exemplary embodiment, the power modules 102 may be insulated gate bipolar transistor (IGBT) power modules, each including at least one power transistor such as, for example, an IGBT or the like.

The motor controller 100 further includes a plurality of inductor assemblies 103 and 104 arranged on the substrate 101. The inductor assemblies 103 and 104 may be in electrical communication with one or more of the power modules 102. Furthermore, the inductor assemblies 103 and 104 may be arranged to receive airflow from a plurality of air sources for enhanced air cooling. Moreover, the inductor assemblies 103 and 104 may also be mounted to the substrate 101 using a thermal interface material which allows for heat conduction between the inductor assemblies 103 and 104 and the substrate 101. For example, the thermal interface material may include an adhesive backed gap pad. According to one exemplary embodiment, the gap pad may be a high performance thermal conductivity gap filler pad such as, for example, SARCON®-XR-m with a thermal conductivity of about 17 Watt/meter-Kelvin offered by Fujipoly®. In embodiments, the high performance thermal conductivity gap filler pad may be formed of silicone, Indium film, and/or any other materials.

Hereinafter, a more detailed discussion of individual inductor assemblies is provided with reference to FIGS. 2-3.

Figure 2:
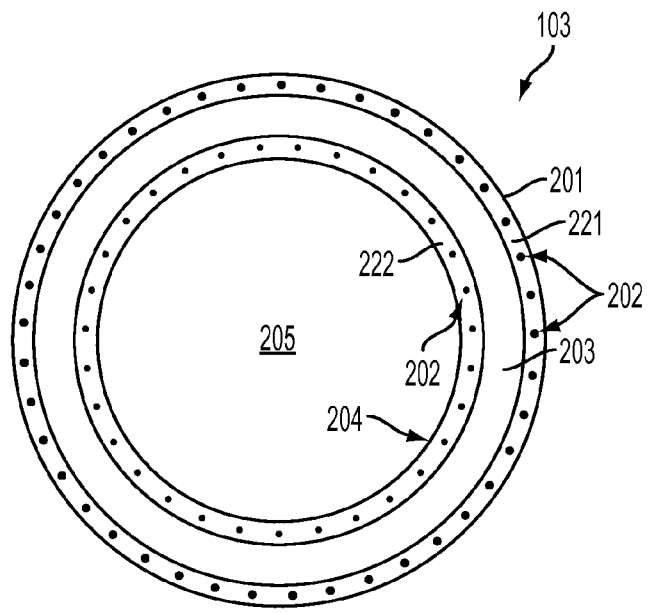
FIG. 2 illustrates a top-view of an inductor of the motor controller of FIG. 1.
Figure 3:
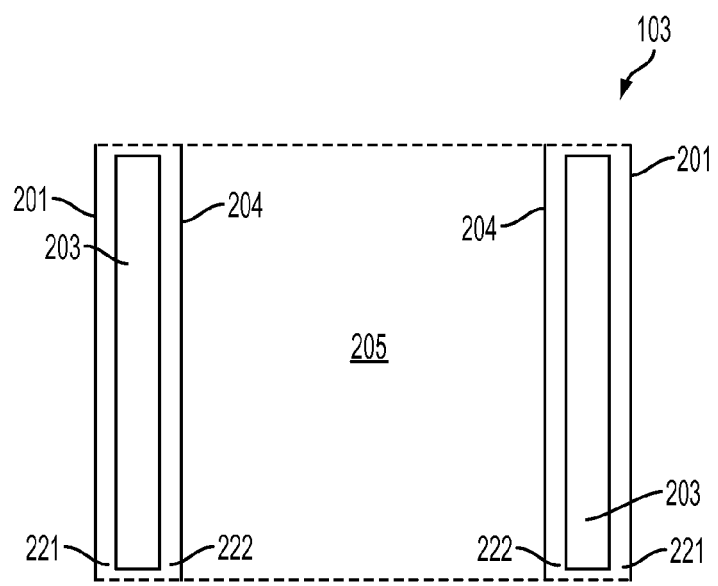
FIG. 3 illustrates a side cutaway view of an inductor of the motor controller of FIG. 1.

Turning to FIGS. 2 and 3, a top-view and a side cutaway view of inductor assembly 103 are illustrated. It is to be understood that although a detailed description of inductor assembly 103 is being made with reference to FIGS. 2 and 3, the inductor assembly 104 (FIG. 1) may be of substantially the same form as illustrated with respect to inductor assembly 103 in FIGS. 2 and 3, albeit of differing scale and/or dimension. The assembly 103 may include an outer cylindrical housing 201. The outer cylindrical housing 201 may be formed of a heat-resistant material, such as thermoplastic. According to one exemplary embodiment, the outer cylindrical housing is formed of a cylinder of polyetherimide (PEI) or polyether ether ketone (PEEK).

The assembly 103 further includes wound inductor core 203 arranged within outer cylindrical housing 201. The wound inductor core 203 may be formed of any suitable core material, including ferromagnetic material or laminated core material. The assembly 103 further includes inductor windings 202 that are wound about the wound inductor core 203. The inductor windings 202 may be formed of conductive wire, for example, stranded or solid-core wire.

The assembly 103 further includes inner cylindrical housing 204 arranged within the wound inductor core 203. The inner cylindrical housing 204 may be formed of the same or similar material as the outer cylindrical housing 201. Furthermore, the inner cylindrical housing 204 defines an inner cylindrical cavity 205 disposed to transmit air. For example, cooling air from an air source may be passed through the inner cylindrical cavity 205. Moreover, as illustrated, a first cylindrical gap 221 is defined by the wound inductor core 203 and the outer cylindrical housing 201. Additionally, a second cylindrical gap 222 is defined by the wound inductor core 203 and the inner cylindrical housing 204. The first cylindrical gap 221 and the second cylindrical gap 222 may also be disposed to transmit air. For example, air transmitted through the inner cylindrical cavity 205 may be routed to the first cylindrical gap 221 and the second cylindrical gap 222 such that cooling air circulates about the wound inductor core 203. Alternatively, cooling air from secondary air source may be routed to the first cylindrical gap 221 and the second cylindrical gap 222.

Hereinafter, circulation of cooling air through inductor assemblies is described in detail with reference to FIGS. 4-6.

Figure 4:
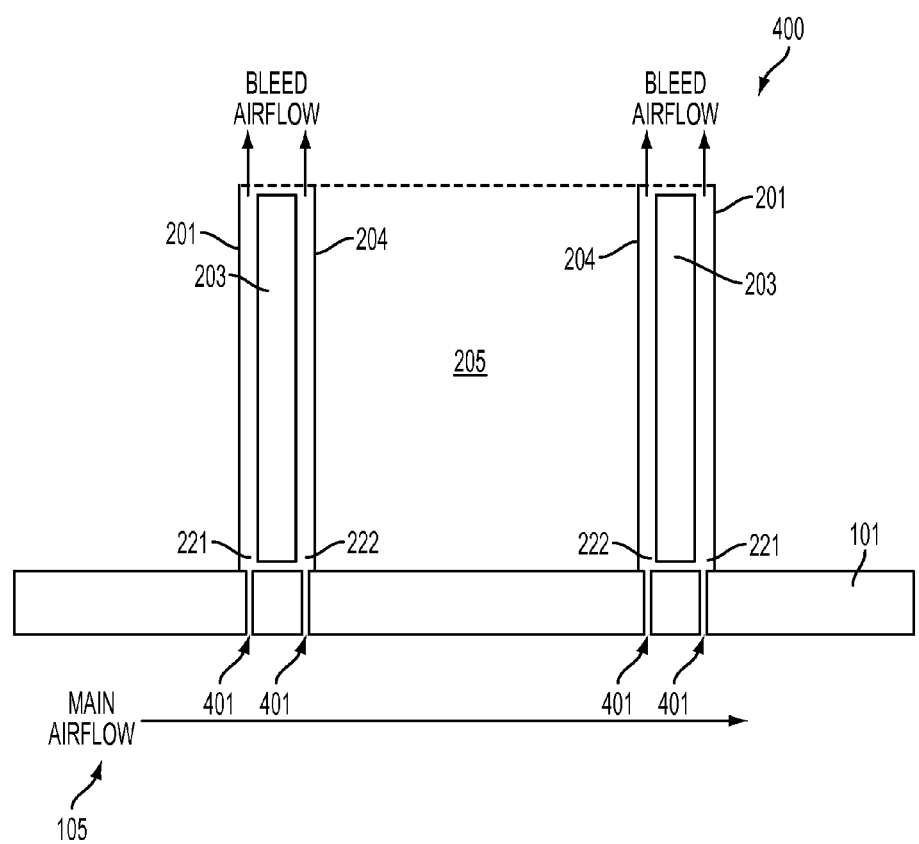
FIG. 4 illustrates a side cutaway view of a portion of an air cooled motor controller, according to an exemplary embodiment of the present invention.

Turning to FIG. 4, a side cutaway view of a portion of an air cooled motor controller 400 is illustrated. The motor controller 400 may be substantially similar to the motor controller 100 as is shown and described with reference to FIG. 1, for example, including a plurality of inductor assemblies 103 and 104 arranged on a substrate 101. As illustrated, the substrate 101 may include a plurality of through-holes 401 arranged therethrough such that the first cylindrical gap 221 and the second cylindrical gap 222 are in fluid communication with a main airflow through channel 105. Therefore, "bleed airflow" may form within the first cylindrical gap 221 and the second cylindrical gap 222 such that the wound inductor 203 is cooled by convection.

The main airflow may be supplied through channel 105. The channel 105 may be provided air from an environmental control system (ECS) of an aircraft. Accordingly, the air from the ECS may be filtered and/or dehumidified to reduce deterioration, corrosion or possibility of electrical short of the wound inductor core 203. In addition, the air flow path may be reversed. Fresh air can enter the inductor, flow through gaps 221 and 222 and then enter the main flow path 105. Thus, the inductor cooling flow can form the main airflow. Alternatively, a secondary air source may be used to cool the wound inductor core 203 as illustrated in FIGS. 5-7.

Figure 5:
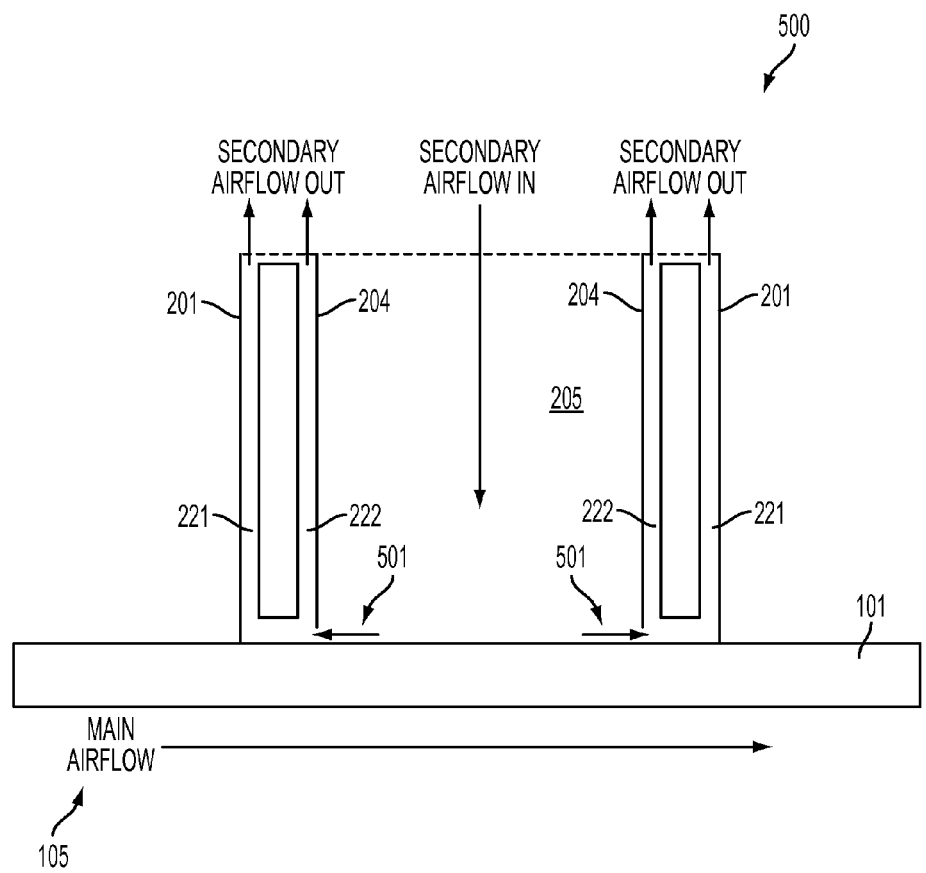
FIG. 5 illustrates a side cutaway view of a portion of an additional air cooled motor controller, according to an exemplary embodiment of the present invention.

FIG. 5 illustrates a side cutaway view of a portion of an additional air cooled motor controller 500. The motor controller 500 may be somewhat similar to the motor controller 100, for example, including a plurality of inductor assemblies 103 and 104 arranged on a substrate 101. As illustrated, a secondary airflow (e.g., from a secondary air source) may be established in the cylindrical cavity 205 in addition to the main airflow flowing from channel 105 proximate the substrate 101. The secondary airflow may be routed into the cylindrical cavity 205 and further through a gap 501 in the inner cylindrical housing 204, and into the first cylindrical gap 221 and the second cylindrical gap 222. The gap 501 may be a cylindrical gap formed through a gap filler pad (not illustrated) providing structural support and spacing between the inner cylindrical housing 204 and the substrate 101. The secondary airflow may flow over the wound inductor core 203 to provide cooling. Circulated air may exit the first cylindrical gap 221 and the second cylindrical gap 222. The secondary airflow may be provided from a secondary air source, such as a filtered air source. Therefore, ECS air may be used for the main airflow from channel 105, and the secondary air source may be used directly as the secondary air flow. Because the secondary air source may provide filtered air, deterioration of the wound inductor core 203 may be reduced. The air flow direction may be reversed, where flow enters through channels 221 and 222 and exits through 205.

As described above, the secondary airflow may be provided from a secondary air source. Accordingly, an air plenum or other routing device may be used to route air from the secondary air source to limit contamination from a main airflow from channel 105. Hereinafter, air cooled motor controllers fitted with air plenums are described in more detail with reference to FIGS. 6-7.

Figure 6:
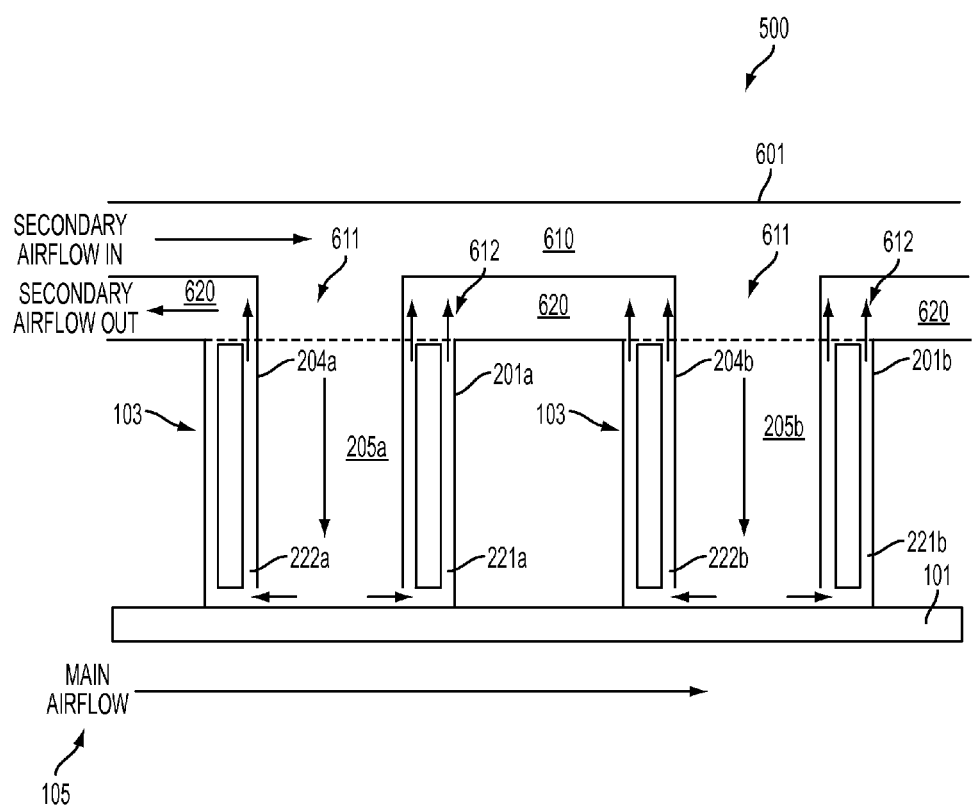
FIG. 6 illustrates a side cutaway view of a portion of the air cooled motor controller of FIG. 5 fitted with an air plenum, according to an exemplary embodiment of the present invention.
Figure 7:
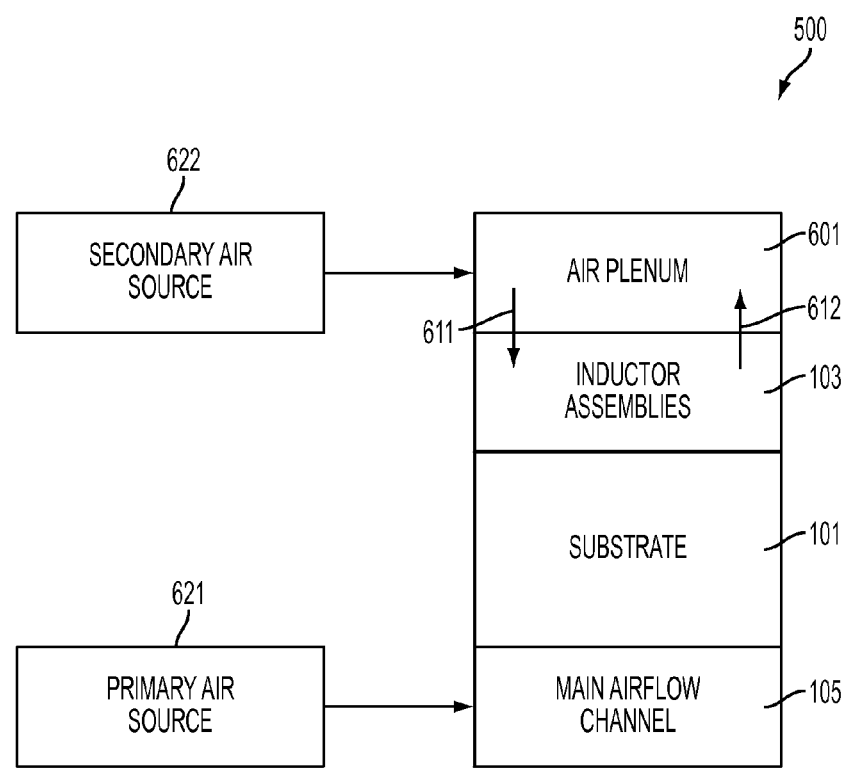
FIG. 7 is a schematic representation of the air cooled motor controller of FIG. 6.

FIG. 6 illustrates a side cutaway view of a portion of the air cooled motor controller of FIG. 5 fitted with an air plenum 601. As illustrated, the air plenum 601 may be arranged on the inductor assemblies 103. The air plenum 601 includes a first airflow chamber 610 configured to transmit air from a secondary air source to inner cylindrical cavities 205a and 205b of inductor assemblies 103. The first airflow chamber 610 may include a plurality of cylindrical ports 611 configured to mate with inner cylindrical housings 204a and 204b of inductor assemblies 103. Accordingly, air flowing from the secondary air source may enter the first airflow chamber 610, and may exit through cylindrical ports 611 into associated inner cylindrical cavities 205a and 205b.

The air plenum 601 further includes second airflow chamber 620 proximate the first airflow chamber 610 and the inductor assemblies 103. The second airflow chamber 620 may include a plurality of toroidal ports 612 configured to mate with the outer cylindrical housings 201a and 201b of the inductor assemblies 103. Accordingly, air flowing through the first cylindrical gaps 221a and 221b and the second cylindrical gaps 222a and 222b may exit through the toroidal ports 612.

Although particularly illustrated as having air entering through the first airflow chamber 610 and exiting through the second airflow chamber 620, it should be understood that the same is easily reversed according to any desired implementation.

Turning now to FIG. 7, a simplified schematic of the air cooled motor controller 500 is illustrated. The motor controller includes a substrate 101, a plurality of inductor assemblies 103 arranged on the substrate 101, and an air plenum 601 arranged on the plurality of inductor assemblies. The air plenum may be configured to route air from secondary air source 622 through inductor assemblies 103 and direct associated exhaust away from the inductor assemblies 103. Furthermore, the substrate 101 is arranged proximate a main airflow channel 105 receiving airflow from a primary or main air source 621, for example, an Environmental Control System of an aircraft.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An air cooled motor controller, comprising:
   a substrate;
   at least one inductor assembly arranged on the substrate, wherein the at least one inductor assembly includes an outer cylindrical housing, a wound inductor core arranged within the outer cylindrical housing, and an inner cylindrical housing arranged within the wound inductor core, wherein the inner cylindrical housing defines an inner cylindrical cavity that transmits air, and wherein the outer cylindrical housing and the inner cylindrical housing define at least one cylindrical gap in fluid communication with the inner cylindrical cavity and that transmits air;
   at least one air source in fluid communication with the at least one cylindrical gap;
   wherein the air plenum comprises:
      a first airflow chamber in fluid communication between the at least one air source and the at least one cylindrical gap; and
      a second airflow chamber in fluid communication with the inner cylindrical cavity and that transmits exhaust air from the inner cylindrical cavity.

2. The motor controller of claim 1, further comprising:
   an air plenum arranged on the at least one inductor assembly.

3. The motor controller of claim 2, wherein the air plenum transmits air to the at least one cylindrical gap from the at least one air source.

4. The motor controller of claim 1, further comprising:
   an airflow channel proximate the substrate; and
   a second air source in fluid communication with the substrate, wherein the second air source is an Environmental Control System of an aircraft and the at least one air source is a dedicated filtered cooling air source.

* * * * *